United States Patent
Watanabe

(10) Patent No.: US 6,656,780 B2
(45) Date of Patent: Dec. 2, 2003

(54) METHOD OF MANUFACTURING A SEMICONDUCTOR DEVICE HAVING NITROGEN IONS BY TWICE RTA PROCESSES

(75) Inventor: Hitomi Watanabe, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 09/916,518

(22) Filed: Jul. 27, 2001

(65) Prior Publication Data

US 2002/0039816 A1 Apr. 4, 2002

(51) Int. Cl.$^7$ .............................................. H01L 21/336

(52) U.S. Cl. ........................ 438/197; 438/710; 438/213; 438/775

(58) Field of Search .................................. 438/197, 287, 438/710, 724, 757, 766, 213, 153, 151, 775, 264, 516, 530, 585, 769, 777

(56) References Cited

U.S. PATENT DOCUMENTS

| | | | | |
|---|---|---|---|---|
| 6,087,229 A | * | 7/2000 | Aronowitz et al. | 438/287 |
| 6,143,592 A | * | 11/2000 | Ueda | 438/197 |
| 6,284,580 B1 | * | 9/2001 | Takehiro | 438/197 |
| 2001/0012653 A1 | * | 8/2001 | Tsukamoto | 438/197 |

* cited by examiner

Primary Examiner—Carl Whitehead, Jr.
Assistant Examiner—Yennhu B. Huynh
(74) Attorney, Agent, or Firm—Adams & Wilks

(57) ABSTRACT

In the fabrication of a MOS transistor, a single process step is performed for controlling the threshold voltage of the transistor and improving the reliability of a gate insulating film so that the number of manufacturing steps is decreased. A desired amount of fixed electric charge is provided at an interface between a semiconductor substrate and the gate insulating film by a nitriding process performed on the gate insulating film to form a channel region and control the threshold voltage of the MOS transistor, so that both an improvement in the reliability of the gate insulating film and control of the threshold voltage of the MOS transistor are performed in one step.

12 Claims, 2 Drawing Sheets

METHOD OF MANUFACTURING A SEMICONDUCTOR DEVICE HAVING NITROGEN IONS BY TWICE RTA PROCESSES

BACKGROUND OF THE INVENTION

1. Field of the Invention

The present invention relates to a method of manufacturing a semiconductor device, and more particularly, to a method of controlling a threshold of a MOS transistor and improving the reliability of a gate insulating film of the MOS transistor.

2. Description of the Related Art

Conventionally, when a MOS transistor is manufactured on a semiconductor substrate, the following steps have been used to control the threshold of the MOS transistor.

First, as shown in FIG. 2A, an element separating film 10 and a gate insulating film 11 are formed on a silicon semiconductor substrate 9 by a well-known technique.

Next, as shown in FIG. 2B, for the purpose of controlling an impurity concentration of a channel region so that the threshold of the MOS transistor is made a desired one, an impurity is injected into a portion under the gate insulating film by a well-known technique, for example, an ion implantation method.

Further, in the case where it is necessary to raise the reliability of the MOS transistor, as shown in FIG. 2C, a treatment for improving the reliability of the gate insulating film is carried out by a well-known technique.

Next, as shown in FIG. 2D, a gate electrode film 12(a) is formed by a well-known technique.

Subsequently, as shown in FIG. 2E, the gate electrode film 12(a) is patterned so that a gate electrode film 12(b) of the transistor is formed by etching removal, and subsequently, a source/drain 13 of the transistor, an interlayer insulating film 14, a contact hole 15, and a metal wiring line 16 are formed by a well-known technique, so that the MOS transistor is manufactured.

In the conventional manufacturing method, the step of controlling the threshold of the MOS transistor and the step of improving the reliability of the gate insulating film are independent from each other, and there has been a problem that the number of manufacturing steps becomes large in order to obtain a highly reliable MOS transistor.

SUMMARY OF THE INVENTION

An object of the present invention is to improve a manufacturing method of a semiconductor device to thereby eliminate the above-mentioned problem.

According to a manufacturing method of the present invention, for the purpose of controlling a threshold of a MOS transistor, a nitriding treatment to a gate insulating film is used, with the result that both improving the reliability of the gate insulating film and controlling the threshold of the MOS transistor can be attained by one process step.

DETAILED DESCRIPTION OF THE PREFERRED EMBODIMENTS

A first embodiment of the present invention will be described below.

Figure 1A:
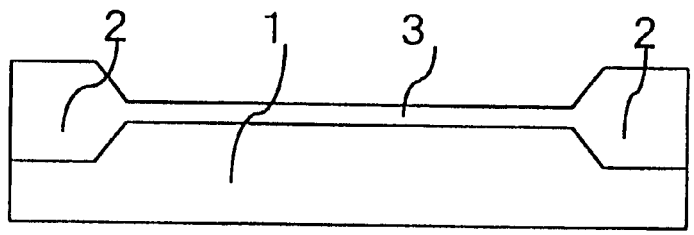
FIGS. 1A to 1D are explanatory views of a first embodiment of the present invention.

First, as shown in FIG. 1A, an element separating film 2 is formed on a silicon semiconductor substrate 1 by a well-known technique, and a gate insulating film 3 is formed to a thickness of 30 to 650 Å by, for example, thermal oxidation of the silicon semiconductor substrate.

Figure 1B:
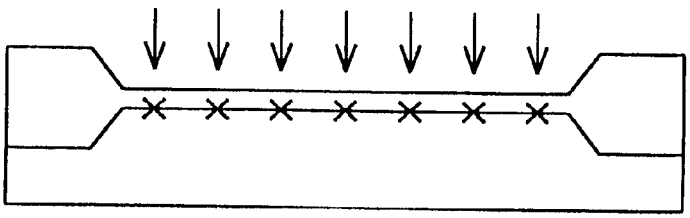

Next, as shown in FIG. 1B, a nitriding treatment is carried out to the gate insulating film. Normally, this step is carried out by RTA (Rapid-Thermal-Annealing) with a lamp annealer or the like, and for example, subsequently to a treatment of 800 to 1125° C. for 15 to 120 seconds under a $N_2O$ atmosphere, or a treatment of 800 to 1100° C. for 5 to 90 seconds under a $NH_3$ atmosphere, a treatment of 800 to 1125° C. for 15 to 120 seconds under an $O_2$ atmosphere is carried out.

By this nitriding treatment, nitrogen exists as a negative fixed electric charge in an interface between the silicon semiconductor substrate and the gate insulating film. This causes the same result as a case where for example, phosphorus is injected into a portion under the gate insulating film by an ion implantation method to control the threshold.

A low threshold side or a depression type is obtained for an N-channel MOS transistor, and although an embedded channel type is obtained in the case where formation is made by the ion implantation of phosphorus, since nitrogen exists as the fixed electric charge in the interface of the substrate, a surface channel type is obtained, and a subthreshold characteristic is improved.

Similarly, also with respect to a P-channel MOS transistor, since a threshold can be raised without increasing the impurity concentration of a channel region, a substrate effect is suppressed, and a subthreshold characteristic is improved.

Since an amount of variation of the threshold is determined by an amount of the fixed electric charge existing in the interface of the gate insulating film, a desired threshold can be obtained by changing a treatment temperature or a treatment time under the $N_2O$ atmosphere or $NH_3$ atmosphere, and the $O_2$ atmosphere at the time of the nitriding treatment.

At the same time, by this step, nitrogen compensates an interface level, a trap, and an uncombined hand of crystal in the interface of the gate insulating film, and the reliability of the gate insulating film of hot electron resistance or the like is improved.

If this step is applied to a method of manufacturing a CMOS transistor, it is needless to say that the foregoing effect can be exerted on both an N and a P channel MOS transistors at one time.

Figure 1C:
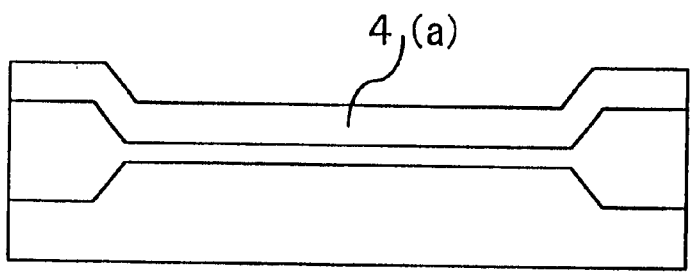

Next, as shown in FIG. 1C, a gate electrode film 4(a) of, for example, polycrystalline silicon is formed to a thickness of 1000 to 4000 Å.

Figure 1D:
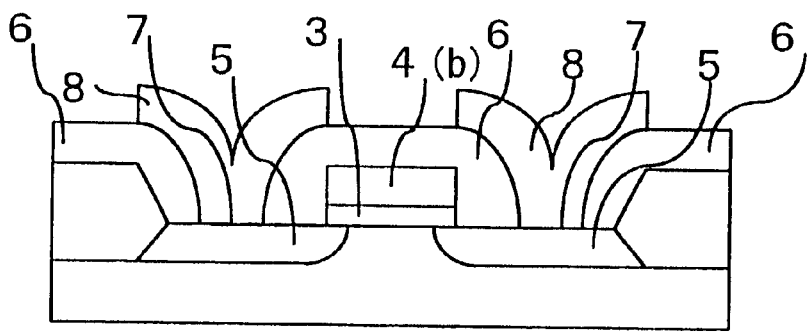
Figure 2A:
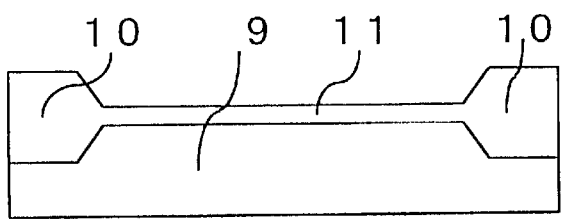
FIGS. 2A to 2E are explanatory views of a conventional technique.
Figure 2B:
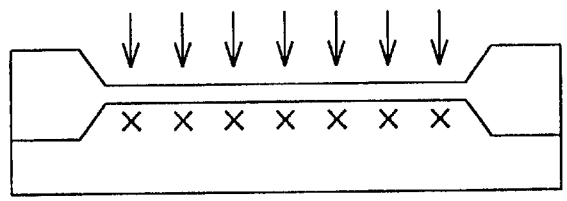
Figure 2C:
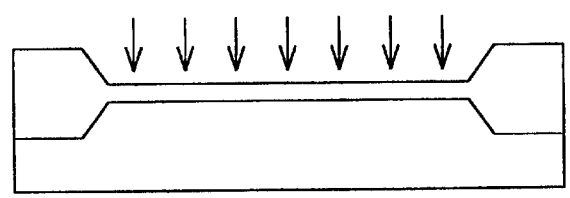
Figure 2D:
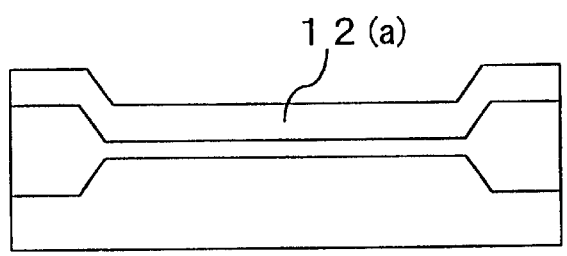
Figure 2E:
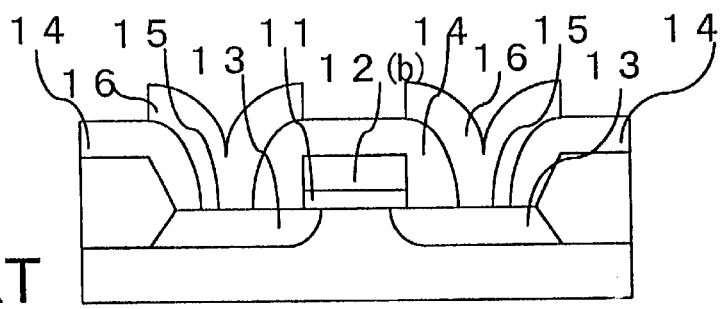

Subsequently, as shown in FIG. 1D, the gate electrode film 4(a) is patterned so that a gate electrode film 4(b) of a transistor is formed by etching removal, and subsequently, a source/drain 5, an interlayer insulating film 6, a contact hole 7, and a metal wiring line 8 of the transistor are formed by a well-known technique and the MOS transistor is manufactured.

As described above, according to the present invention, since the nitriding treatment of a gate insulating film is used for the control of the threshold, there are effects as set forth below.

1. The control of the threshold of a MOS transistor and the improvement of reliability thereof can be attained in the same step, and the number of manufacturing steps can be decreased.
2. Since the threshold of a MOS transistor is controlled by a fixed electric charge in an interface of a gate insulating film, a substrate effect of a transistor is suppressed, and a subthreshold characteristic is improved.

What is claimed is:

1. A method of manufacturing a MOS transistor comprising the steps of: providing a silicon semiconductor substrate; forming a gate oxide film on the silicon substrate by thermal oxidation; nitriding the gate oxide film by performing a first RTA (Rapid-Thermal-Annealing) process in an atmosphere of either $NH_3$ or $N_2O$ and a second RTA process in an atmosphere of O2 to produce a desired concentration of nitrogen ions at an interface of the gate oxide film and the silicon substrate to form a channel region and set a threshold voltage of the MOS transistor; and forming a gate electrode on the nitrided gate insulating film.

2. A method of manufacturing a MOS transistor according to claim 1; wherein the first RTA process is carried out in an $NH_3$ atmosphere.

3. A method of manufacturing a MOS transistor according to claim 2; wherein the second RTA process is performed subsequently to the first RTA process.

4. A method of manufacturing a MOS transistor according to claim 1; wherein the first RTA process is carried out in an $N_2O$ atmosphere.

5. A method of manufacturing a MOS transistor according to claim 4; wherein the second RTA process is performed subsequently to the first RTA process.

6. A method of manufacturing an N-channel depletion type MOS transistor, comprising the steps of: providing a silicon semiconductor substrate; forming a gate oxide film on the silicon semiconductor substrate; nitriding the gate oxide film by performing a first RTA process in an atmosphere of either $NH_3$ or $H_2O$ and a second RTA process in an atmosphere of $O_2$ to produce a desired concentration of nitrogen ions at an interface of the gate oxide film and the silicon substrate to form a channel region and set a threshold voltage of the MOS transistor; and forming a gate electrode on the nitrided gate oxide film.

7. A method of manufacturing a MOS transistor comprising the steps of: forming a gate insulating film on a silicon substrate; forming a desired concentration of nitrogen ions at an interface between the silicon substrate and the gate insulating film by performing a first RTA process in an atmosphere of either $NH_3$ or $N_2O$ and a second RTA process in an atmosphere of $O_2$ to set a threshold voltage of the MOS transistor; forming source and drain regions in the silicon substrate; and forming a gate electrode on the gate insulating film.

8. A method of manufacturing a MOS transistor according to claim 7; wherein the step of forming nitrogen ions by RTA comprises the step of nitriding the gate insulating film.

9. A method of manufacturing a MOS transistor according to claim 8; wherein the first RTA process is carried out in an $NH_3$ atmosphere.

10. A method of manufacturing a MOS transistor according to claim 9; wherein the second RTA process is performed subsequently to the first RTA process.

11. A method of manufacturing a MOS transistor according to claim 8; wherein the first RTA process is carried out in an $N_2O$ atmosphere.

12. A method of manufacturing a MOS transistor according to claim 11; wherein the second RTA process is performed subsequently to the first RTA process.

* * * * *